United States Patent
Mori et al.

(10) Patent No.: US 11,956,870 B2
(45) Date of Patent: Apr. 9, 2024

(54) LIGHT-SOURCE DEVICE

(71) Applicant: NICHIA CORPORATION, Anan (JP)

(72) Inventors: Daisuke Mori, Komatsushima (JP); Hironobu Shibata, Tokushima (JP); Ryosuke Mori, Anan (JP); Masaki Omori, Toshima-ku (JP); Hideki Kondo, Yokohama (JP)

(73) Assignee: NICHIA CORPORATION, Anan (JP)

( * ) Notice: Subject to any disclaimer, the term of this patent is extended or adjusted under 35 U.S.C. 154(b) by 15 days.

(21) Appl. No.: 17/785,899

(22) PCT Filed: Dec. 8, 2020

(86) PCT No.: PCT/JP2020/045742
§ 371 (c)(1),
(2) Date: Jun. 15, 2022

(87) PCT Pub. No.: WO2021/124994
PCT Pub. Date: Jun. 24, 2021

(65) Prior Publication Data
US 2023/0023001 A1 Jan. 26, 2023

(30) Foreign Application Priority Data
Dec. 18, 2019 (JP) .................. 2019-228191

(51) Int. Cl.
*H05B 45/345* (2020.01)
*H01S 5/06* (2006.01)
*H02M 3/156* (2006.01)
*H05B 45/14* (2020.01)

(52) U.S. Cl.
CPC ............. *H05B 45/345* (2020.01); *H01S 5/06* (2013.01); *H05B 45/14* (2020.01); *H02M 3/156* (2013.01)

(58) Field of Classification Search
CPC ...... H05B 45/345; H05B 45/14; H05B 45/50; H01S 5/06; H02M 3/156
See application file for complete search history.

(56) References Cited

U.S. PATENT DOCUMENTS

| 2009/0066264 | A1 | 3/2009 | Huang et al. |
| 2010/0033109 | A1 | 2/2010 | Liu et al. |
| 2010/0283773 | A1 | 11/2010 | Kim |
| 2012/0181941 | A1 | 7/2012 | Kimura et al. |

(Continued)

FOREIGN PATENT DOCUMENTS

| CN | 2037326 U | * | 5/1989 |
| CN | 201051011 Y | * | 4/2008 |

(Continued)

*Primary Examiner* — Abdullah A Riyami
*Assistant Examiner* — Syed M Kaiser
(74) *Attorney, Agent, or Firm* — MORI & WARD, LLP

(57) ABSTRACT

A light source device that supplies a constant current to a diode load that includes a plurality of light-emitting elements connected in series. The light source device includes a power supply circuit connected to the diode load and a peak current limiting circuit connected in series to the diode load. The peak current limiting circuit includes a current detector that is connected in series to the diode load and a current-regulating circuit that controls a current to the diode load by a detection voltage of the current detector. Further, the current detector has a series circuit including a resistor and a coil.

20 Claims, 5 Drawing Sheets

(56) References Cited

U.S. PATENT DOCUMENTS

| | | | |
|---|---|---|---|
| 2016/0081171 A1 | 3/2016 | Ichikawa | |
| 2016/0205742 A1* | 7/2016 | Seki et al. | |
| 2017/0231045 A1* | 8/2017 | Hu | H05B 45/375 |
| 2018/0035507 A1* | 2/2018 | Kumada | H05B 45/10 |

FOREIGN PATENT DOCUMENTS

| | | |
|---|---|---|
| CN | 109496008 | 3/2019 |
| JP | 58-194383 | 11/1983 |
| JP | 05-161253 | 6/1993 |
| JP | 07-235695 | 9/1995 |
| JP | 2006-013557 | 1/2006 |
| JP | 2010-040509 | 2/2010 |
| JP | 2010-262929 | 11/2010 |
| JP | 2012-164633 | 8/2012 |
| JP | 2013-033644 | 2/2013 |
| JP | 2016-122643 | 7/2016 |
| JP | 2016-129129 | 7/2016 |
| JP | 2019-125712 | 7/2019 |

* cited by examiner

__US 11,956,870 B2__

LIGHT-SOURCE DEVICE

CROSS-REFERENCE TO RELATED APPLICATIONS

The present application is a national phase application of PCT Application No. PCT/JP2020/045742, filed on Dec. 8, 2020, and claims priority under 35 U. S. C. § 119 to Japanese Patent Application No. 2019-228191, filed on Dec. 18, 2019, the content of which are incorporated herein by reference in their entirety.

BACKGROUND

The present disclosure relates to a light source device including a plurality of light-emitting elements connected in series.

In a light source device using a light-emitting diode for a light source, a light-emitting diode may be connected to a constant-current circuit and is turned on, because electrical resistance of a light-emitting diode varies according to voltages or currents and voltage-current characteristics do not change linearly. Also, in such a light source device, in order to increase light-emitting output, a plurality of light-emitting diodes are connected in series and are turned on simultaneously. The light source device includes a constant-current circuit to supply a constant current to each of the light-emitting diodes connected in series and turn them on (see JP2016-129129A).

SUMMARY OF INVENTION

The constant-current circuit operates to detect an increase in current and controls the current to a constant current. However, a time-lag may occur until the increase in current is detected and the current is controlled to a constant current. The time-lag instantaneously causes an excessive peak current to flow. The peak current may cause a failure in a normal light-emitting element due to overcurrent.

The present disclosure provides a light source device in which occurrence of a failure in any of light-emitting elements can be prevented from having an effect on other light-emitting elements.

A light source device of the present disclosure is configured to supply a constant current to a diode load that includes a plurality of light-emitting elements connected in series. The light source device includes a power supply circuit connected to the diode load and a peak current limiting circuit connected in series to the diode load. The peak current limiting circuit includes a current detector connected in series to the diode load and a current-regulating circuit that controls a current to the diode load by a detection voltage of the current detector. Further, the current detector consists of a series circuit including a resistor and a coil.

According to the present disclosure, an effect on other light-emitting elements due to a failure in any of light-emitting elements can be reduced.

DESCRIPTION

Figure 1:
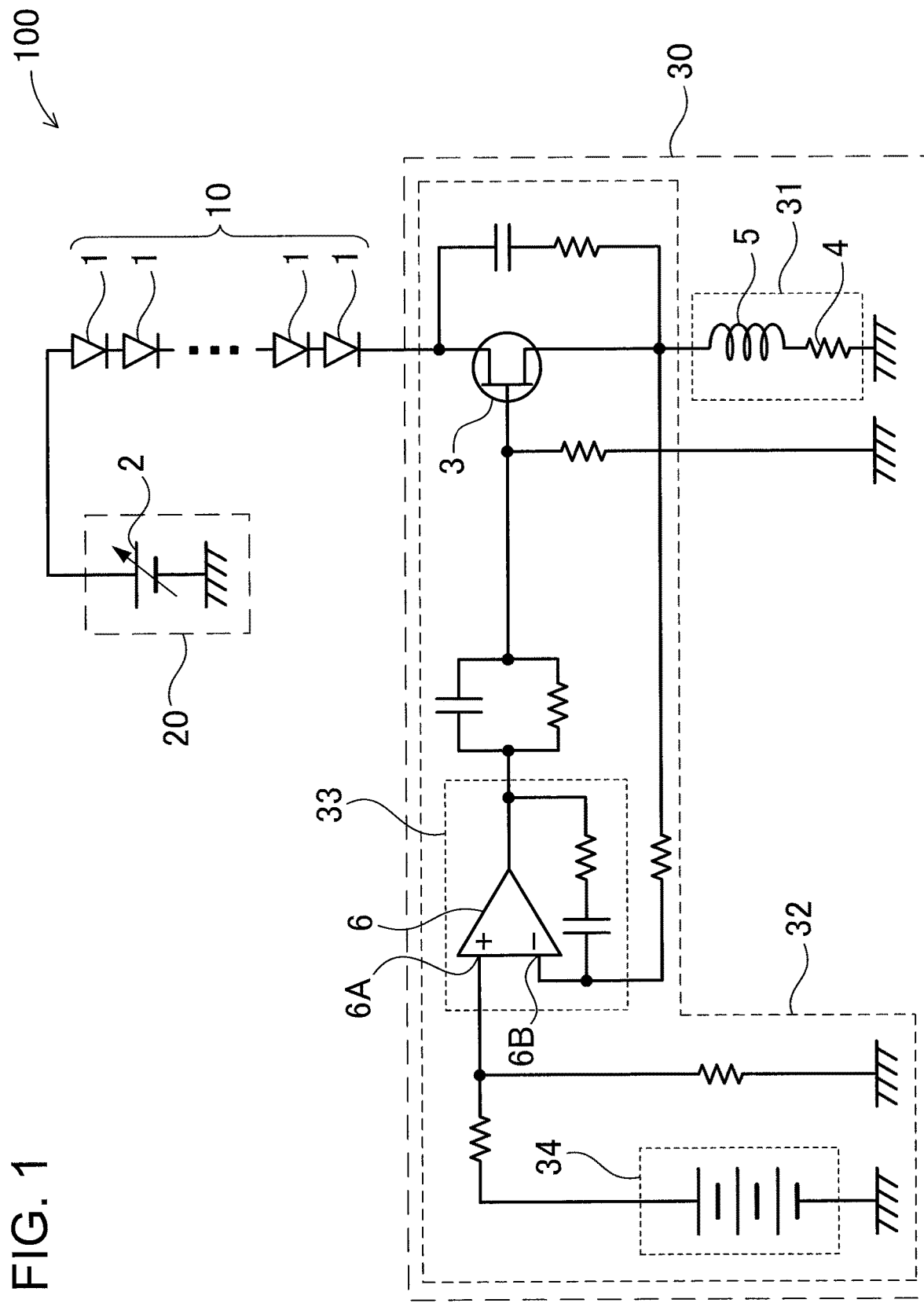
FIG. 1 is a block diagram of a light source device according to a first embodiment.

A light source device according to an embodiment supplies a constant current to a diode load including a plurality of light-emitting elements connected in series, the light source device including a power supply circuit connected to the diode load and a peak current limiting circuit connected in series to the diode load, the peak current limiting circuit including a current detector that is connected in series to the diode load, and a current-regulating circuit that controls a current to the diode load by a detection voltage of the current detector, the current detector consisting of a series circuit including a resistor and a coil.

The light source device described above includes the peak current limiting circuit connected in series to the diode load that includes a plurality of light-emitting elements connected in series. In the peak current limiting circuit, the current detector connected in series to the diode load and the current-regulating circuit that controls a current to the diode load by a detection voltage of the current detector are provided. Further, in the current detector, the coil is connected in series to the resistor. When a failure, such as an internal short circuit, occurs in any of the light-emitting elements to cause a sharp decrease of electrical resistance of the diode load and increase the current instantaneously, in the coil of the current detector, a peak voltage is instantaneously induced across the coil in proportion to the rapid current change in the diode load and the inductance of the coil. The peak voltage that is induced instantaneously allows the current-regulating circuit to be controlled and instantaneously reduces a current to the diode load that is an output current. Accordingly, in a state in which any of the light-emitting elements fails and an instantaneous decrease of the electrical resistance of the diode load occurs, the current to the diode load can be controlled at a very high response speed, and the increase in current can be prevented.

In particular, in the light source device described above, the coil is connected in series to the resistor of the current detector, and the current-regulating circuit is controlled by the peak voltage induced in the coil, that is, the peak voltage is negative-fed back to an input side of the current-regulating circuit to control the current to the diode load, so that the coil having a very small inductance allows for preventing the instantaneous increase in current to the diode load. For example, in the light source device of the example below, the coil connected in series to the resistor has an inductance of 0.9 pH, which is very small. In particular, in the light source device described above, the instantaneous increase in current to the diode load can be limited with a simple structure in which the coil having a very small inductance is connected to the current detector of the peak current limiting circuit provided to stabilize the current to the diode load at a constant value.

Also, after the instantaneous peak current is reduced by the inductance of the coil, the current to the diode load can be stabilized at a constant value by the resistor of the current detector. Accordingly, in the light source device including a plurality of light-emitting elements connected in series, if the electrical resistance decreases in any of the light-emitting elements due to a fault such as an internal short circuit, other light-emitting elements can be protected against harmful effects of overcurrent and a predetermined constant current can flow through the diode load in the same manner as before the light-emitting element fails. Accordingly, if any of the light-emitting elements fails in the light source device described above, other light-emitting elements are protected against a peak current that will instantaneously flow. Further, even if the number of light-emitting elements connected in series is small, a predetermined constant current value is stabilized, so that the light-emitting elements in the diode load can be turned on.

In a light source device according to another embodiment, a current-regulating circuit includes a transistor connected in series to the diode load and the current detector, a comparator connected to an input side of the transistor, and a reference voltage circuit configured to input a reference voltage to a first input terminal of the comparator. The detection voltage induced in the current detector is input to a second input terminal of the comparator. An output of the comparator is input to the transistor. The transistor can control the current to the diode load.

In a light source device according to still another embodiment, the transistor can be a FET. In a light source device according to still yet another embodiment, a plurality of FET can be connected in parallel.

In a light source device according to still yet another embodiment, the reference voltage circuit can be a circuit that can change the reference voltage.

In a light source device according to still yet another embodiment, a sub-amplifier to amplify a voltage induced in the current detector is included, and an output voltage of the sub-amplifier can be input to an input terminal of the comparator.

In a light source device according to still yet another embodiment, a buffer amplifier may be connected between an output side of the comparator and the input side of the transistor to reduce and output an output impedance of the comparator.

In a light source device according to still yet another embodiment, the power supply circuit can include a constant-current power supply.

In a light source device according to still yet another embodiment, the resistor can be a wire-wound resistor.

In a light source device according to still yet another embodiment, the light-emitting elements can be laser diodes.

The present disclosure will be described below in detail on the basis of the accompanying drawings. The descriptions below include terms indicating specific directions or positions (for example, "up", "down", and other terms inclusive of these terms) as appropriate. Use of these terms is, however, intended to facilitate understanding of the present invention with reference to the drawings, and the meanings of these terms do not limit the technical scope of the present invention. A portion with the same reference numeral in a plurality of drawings represents the same or equivalent portion or member. The embodiments described below are intended to embody the technical idea of the present invention and are not intended to limit the present disclosure to the description below. Unless otherwise specified, sizes, materials, shapes, and relative positions of constituent components described below are not intended to limit the scope of the present invention thereto, but rather are described as examples. Description in one embodiment may be applicable to other embodiments. Sizes or positional relationships of components illustrated in the drawings may be exaggerated in order to clarify the descriptions.

FIGS. 1 to 4 are block diagrams of light source devices 100, 200, 300, and 400 according to the present embodiment. A plurality of light-emitting elements 1 are connected in series to form a diode load 10. The diode load 10 is connected to a constant-current power supply 2 and is turned on when a predetermined constant current is supplied. The light-emitting elements 1 are, for example, light-emitting diodes (LEDs) or laser diodes (LDs). A diode array including the plurality of light-emitting elements 1 that are connected in series and mounted on a circuit board (not shown), or the plurality of light-emitting elements 1 that are electrically connected in a detachable manner, are used for the diode load 10. In the light source devices 100, 200, 300, and 400, when the number of light-emitting elements 1 connected in series are increased and a large number of light-emitting elements 1 are turned on, light-emitting output can be increased. When all light-emitting elements 1 are in a normal operation state, all light-emitting elements 1 are driven at a predetermined constant current supplied from the constant-current power supply 2. However, at a time at which the plurality of light-emitting elements 1 that are connected in series are turned on, if an internal short circuit occurs in any of the light-emitting elements 1 or if an operating voltage sharply decreases in any of the light-emitting elements 1, electrical resistance of the diode load 10 decreases and the current to the diode load 10 is increased. The constant-current power supply 2 detects the increase in current and controls the current to a predetermined value. However, a time-lag occurs until the increased current is controlled to a constant current. The delay in the response time causes an excessive current to flow into unbroken light-emitting elements 1, and a failure occurs due to the current. For example, a failure in any of light-emitting elements has an effect on other light-emitting elements. In particular, in the light source device using a laser diode for the light-emitting element, the light source device tends to fail due to overcurrent or overpower of the laser light, because the laser diode has a good response characteristic.

A semiconductor switching element is connected in series to the output side of the constant-current power supply 2 in which an analog system and a switching system are available. In the analog system, internal resistance of the semiconductor switching element is adjusted to control the output current by controlling a voltage decrease of the semiconductor switching element. In the switching system, the output current is controlled by a DC-DC converter. In the switching system, a constant current characteristic is achieved by a duty of on-off switching of the semiconductor switching element, so that a high power efficiency can be obtained. In the switching system, an electrolytic capacitor having a large electrostatic capacitance is connected to the output side to reduce ripple of an output voltage and thus to form a clean DC current. However, such an electrolytic capacitor causes a delay in the response speed of controlling the output current at a constant value. This is because the time-lag of discharge and charge of the electrolytic capacitor delays the response time of the output current. The constant-current power supply using the switching system with a high power efficiency can reduce power loss of the semiconductor switching element. However, the time-lag caused by the large-capacitance electrolytic capacitor, which is connected to the output side, damages unbroken light-emitting elements due to overcurrent or overpower of the laser light.

First Embodiment

Light-Source Device

FIG. 1 is a block diagram of the light source device 100 according to a first embodiment.

The light source device 100 includes a power supply circuit 20 to supply a current to the diode load 10 in which the plurality of light-emitting elements 1 are connected in series, and a peak current limiting circuit 30 connected in series to the diode load 10. The peak current limiting circuit 30 includes a current detector 31 connected in series to the diode load 10 and a current-regulating circuit 32 that controls a current to the diode load 10 by a detection voltage that is output across both ends of the current detector 31. The current detector 31 is a series circuit including a resistor 4 and a coil 5.

Power Supply Circuit

The power supply circuit 20 includes a constant-current power supply 2 to supply a current that is controlled in advance into the diode load 10. The power supply circuit 20 preferably uses a constant-voltage and constant-current power supply. The constant-voltage and constant-current power supply supplies an output voltage at a predetermined value or less and controls the current to the diode load 10 to a predetermined value. The constant-current power supply 2 preferably includes a circuit to adjust a current value flowing into the diode load 10. The constant-current power supply 2 that can adjust a current value, adjusts a current value to flow into the diode load 10, i.e., an output current, in a range of, for example, 1 A to 10 A and thus supplies an optimum current for the light-emitting elements 1 to turn them on. The constant-current power supply 2 uses a switching system controlling by an output voltage of a DC-DC converter or an analog system. The constant-current power supply 2 using the switching system can have a reduced weight while having increased power efficiency. Reduction in weight can be achieved by omitting a heavy transformer. The constant-current power supply 2 controls the output current to a predetermined value by the duty of on-off switching of the semiconductor switching element. This allows the predetermined current to be widely changed, and an amount of heat generation can be reduced.

Peak Current Limiting Circuit

The current-regulating circuit 32 of the peak current limiting circuit 30 limits an instantaneous increase in current to the diode load 10, which is caused by an internal short circuit in any of the light-emitting elements 1 or a sharp decrease of the operating voltage in any of the light-emitting elements 1, to reduce harmful effects on the light-emitting element 1 due to overcurrent or overpower of the laser light. In the light source device 100 using the constant-current power supply 2 for the power supply circuit 20, the peak current limiting circuit 30 has a predetermined current that is the same as or equivalent to the predetermined current for the constant-current power supply 2 of the power supply circuit 20. In the light source device 100, the constant-current power supply 2 supplies a predetermined constant current to the diode load 10. If an internal short circuit occurs in any of the light-emitting elements 1 or an operating voltage sharply decreases in any of the light-emitting elements 1 and a peak current flows into the diode load 10 caused by a delay in a response time of the constant-current power supply 2, the peak current is reduced by the peak current limiting circuit 30.

Figure 5:
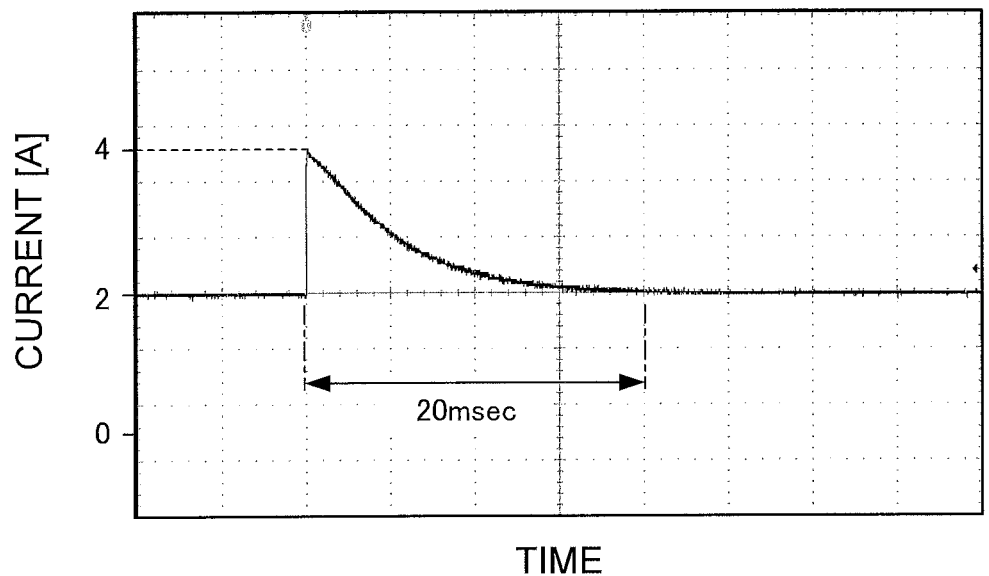
FIG. 5 is a graph showing a current waveform of a light source device that does not include a peak current limiting circuit.

A current characteristic in FIG. 5 shows a current waveform of a light source device that does not include a peak current limiting circuit. The graph shows a state in which a plurality of (for example, twenty) light-emitting elements 1 are connected in series, both ends of a particular light-emitting element 1 are short-circuited, and the current flowing into the diode load 10 is changed. In the case in which the particular light-emitting element 1 is short-circuited, the peak current flows due to a decrease in the electrical resistance of the diode load 10. In the current characteristic shown in FIG. 5, a duration of the peak current, that is, a duration until the peak current attenuates reaches approximately 20 milliseconds. The duration of the peak current flow varies according to the delay in the response time of the constant-current power supply 2. The light-emitting element 1 becomes faulty due to overcurrent or overpower of the laser light.

The peak current limiting circuit 30 reduces the peak current and prevents a failure in the light-emitting element 1 due to overcurrent or over power of the laser light. The current-regulating circuit 32 of the peak current limiting circuit 30 includes a transistor 3 that increases the internal resistance and reduces the peak current at the timing the current detector 31 detects the peak current, and a comparator 33 that increases the internal resistance of the transistor 3 at the timing the current detector 31 detects the peak current. The comparator 33 compares the detection voltage, which is input from the current detector 31, with the reference voltage and outputs a signal to the transistor 3 to increase the internal resistance of the transistor 3 at the timing at which the current detector 31 detects the peak current and the detection voltage is increased.

Current Detector

In the current detector 31, the resistor 4 and the coil 5 are connected in series. In the current detector 31 shown in FIG. 1, the resistor 4 is connected in series to the coil 5. In the current detector 31, electrical resistance of the resistor 4 and an inductance of the coil 5 can be adjusted at an optimum value. A wire-wound resistor in which a resistance wire is wound in a coil shape on a surface of an insulating material such as electrical porcelain can be used for the resistor 4. The wire-wound resistor has an inductance. The electrical resistance is adjusted by resistivity and length of the resistance wire. The inductance is adjusted by the number of turns of the resistance wire. The wire-wound resistor has a structure in which the resistor and the coil are integrated; however, in an equivalent circuit, the resistor and the coil are connected in series.

The voltage across both ends of the resistor 4 increases in proportion to a flowing current. The coil 5 increases the detection voltage of the current detector 31 and reduces the peak current to the diode load 10 at the timing the peak current flows and the current sharply changes. The coil 5 increases the induction voltage at both ends at the timing the peak current occurs. In particular, the detection voltage is increased at the time the peak current rises. This is because a voltage (E) induced by the peak current across both ends of the coil 5 increases in proportion to the inductance (L) of the coil 5 as shown in the following Formula (I).

$$E = L \times di/dt \quad \text{Formula (I)}.$$

In Formula (I), di is a variation in current, dt is a duration for the current to change, and di/dt is a rate of increase in peak current per unit time. The current of the peak current sharply increases at the time of rising. At this timing, di/dt is greatly increased, and the induction voltage becomes considerably high. Accordingly, in the current detector 31 in which the resistor 4 and the coil 5 are connected in series, the induction voltage across both ends of the coil 5 becomes high at the moment the peak current flows, particularly, at the timing the peak current rises, and a high detection voltage is detected. The instantaneously increased detection voltage is input to an input terminal of the comparator 33. The inductance of the coil 5 is set to an optimum value in consideration of the electrical resistance of the resistor 4 connected in series, the current flowing into the diode load 10, the transistor 3, the required response speed, and the like. In an example of a circuit configuration in which the current to the diode load 10 is set in a range of 1 A to 10 A and the electrical resistance of the resistor 4 is set in a range of 0.2Ω to 0.5Ω, the inductance is set in a range of 0.5 pH to 5 pH.

Current-Regulating Circuit

The current-regulating circuit 32 controls the current to the diode load 10 by the detection voltage input from the current detector 31. The current-regulating circuit 32 limits the current to reduce the peak current at the time the peak current flows into the diode load 10 and the detection voltage input from the current detector 31 is instantaneously increased. The current detector 31 detects a high detection voltage at the time the peak current rises, and the current-regulating circuit 32 effectively reduces the current at the timing the detection voltage becomes high, that is, at the timing the peak current flows into the diode load 10. The current-regulating circuit 32 increases the internal resistance of the transistor 3 and reduces the peak current to the diode load 10. Thus, the transistor 3 that is connected in series to the diode load 10 and also the comparator 33 that controls the internal resistance of the transistor 3 by the detection voltage input from the current detector 31 are included.

Transistor

A FET is preferably used for the transistor 3. In particular, a MOSFET having good large-current characteristics is suitable. This is because the FET has large input resistance and small on-resistance, resulting in efficient control of the current. The transistor 3 is not limited to the FET, and any of transistors that can control the internal resistance using the input signal, such as a bipolar transistor and an IGBT, may also be used. In the FET, the internal resistance is controlled by the input voltage. In the FET, rise in the input voltage can decrease the internal resistance, and reduction in the input voltage can increase the internal resistance. Further, a current-regulating circuit 32C of the light source device 400 shown in FIG. 4 includes a plurality of FETs. The plurality of FETs are connected in parallel to each other to allow increase in the maximum allowable current in proportion to the number of FETs connected in parallel.

Comparator

The comparator 33 compares the detection voltage input from the current detector 31 with the reference voltage and controls the internal resistance of the transistor 3. The comparator 33 shown in FIG. 1 includes a differential amplifier 6. The differential amplifier 6 has an output side connected to the input side of the transistor 3 and controls the internal resistance of the transistor 3 by the output voltage. In the differential amplifier 6, a reference voltage circuit 34 to which the reference voltage is input is connected to a first input terminal 6A, and the detection voltage of the current detector 31 is input to a second input terminal 6B. In the differential amplifier 6, a differential voltage between the first input terminal 6A and the second input terminal 6B is output to the transistor 3 with or without amplifying. In the differential amplifier 6, the first input terminal 6A is a positive-side input terminal, and the second input terminal 6B is a negative-side input terminal. The reference voltage circuit 34 is a circuit in which the reference voltage can be changed and changes a predetermined current of the peak current limiting circuit 30.

The peak current limiting circuit 30 described above operates as follows and reduces the peak current to the diode load 10.

1. At the time the peak current flows into the diode load 10, the detection voltage of the current detector 31 increases corresponding to the peak current.

In particular, the change value of the current becomes large at the timing the peak current rises, which increases the voltage induced in the coil 5 at this time, and the detection voltage is instantaneously increased.

2. The instantaneously increased detection voltage is input to the second input terminal 6B provided at the differential amplifier 6, which is the comparator 33.

3. The differential amplifier 6 compares a voltage of the second input terminal 6B with the reference voltage of the first input terminal 6A and changes the output voltage to the negative side if the voltage of the second input terminal 6B is high.

4. The output voltage changed to the negative side is input to the input side of the transistor 3.

5. In the transistor 3 in which the input voltage is changed to the negative side, the internal resistance is increased.

6. The transistor 3 having an increased internal resistance reduces the current to the diode load 10 and reduces the peak current.

The peak current limiting circuit 30 operates as described above and reduces the peak current to the diode load 10. However, the coil 5 connected in series to the resistor 4 instantaneously increases the detection voltage at the time the peak current rises, and the internal resistance of the transistor 3 is instantaneously increased at this timing. The transistor 3 having instantaneously increased internal resistance reduces the current to the diode load 10 and promptly reduces the peak current.

Figure 6:
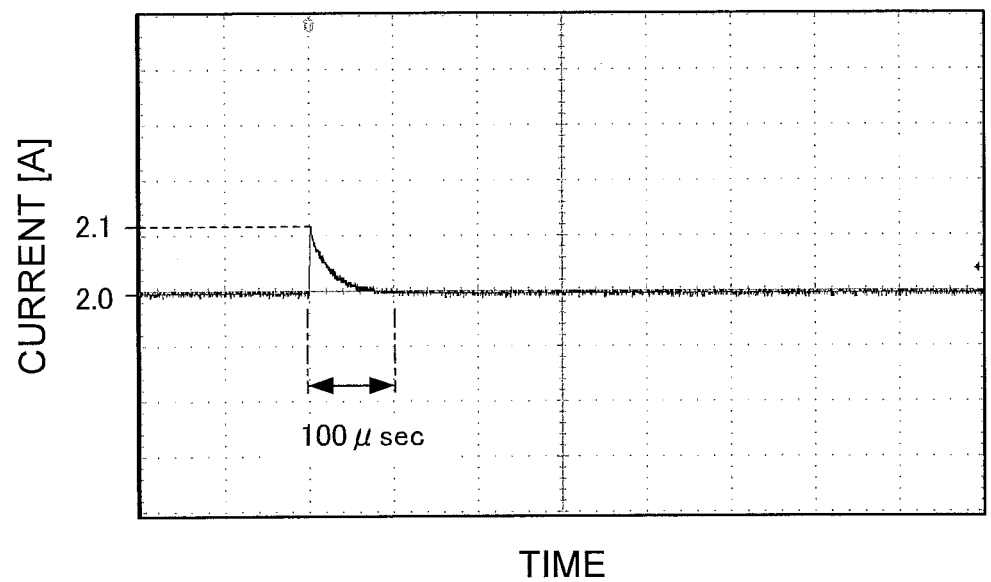
FIG. 6 is a graph showing a current waveform of a light source device that includes a peak current limiting circuit according to an embodiment.

FIG. 6 shows, at the current detector 31, a characteristic of the current flowing into the diode load 10 in the light source device 100 in which the coil 5 is connected in series to the resistor 4. FIG. 5 shows a waveform of the current flowing into the diode load in the light source device using the current detector in which only the resistor is included while the coil is not connected. As shown in FIG. 5, in a light source device in which the current detector consists of only the resistor while the coil is not connected, the duration of peak current flow is approximately 20 milliseconds, which is comparatively long, and the light-emitting element becomes faulty due to overcurrent or overpower of the laser light. In contrast, in the light source device 100 having the current detector 31 in which the coil 5 is connected, as shown in FIG. 6, the duration of peak current flow is shortened to approximately 1/200, that is, approximately 100 microseconds, and the maximum current of the peak current is reduced, which can prevent a failure of the light-emitting element 1 due to overcurrent or overpower of the laser light. FIG. 6 shows a current characteristic of a measurement in which the current to the diode load is 2 A, the electrical resistance of the resistor is 0.5Ω, and the inductance of the coil is 0.9 pH.

Second Embodiment

Figure 2:
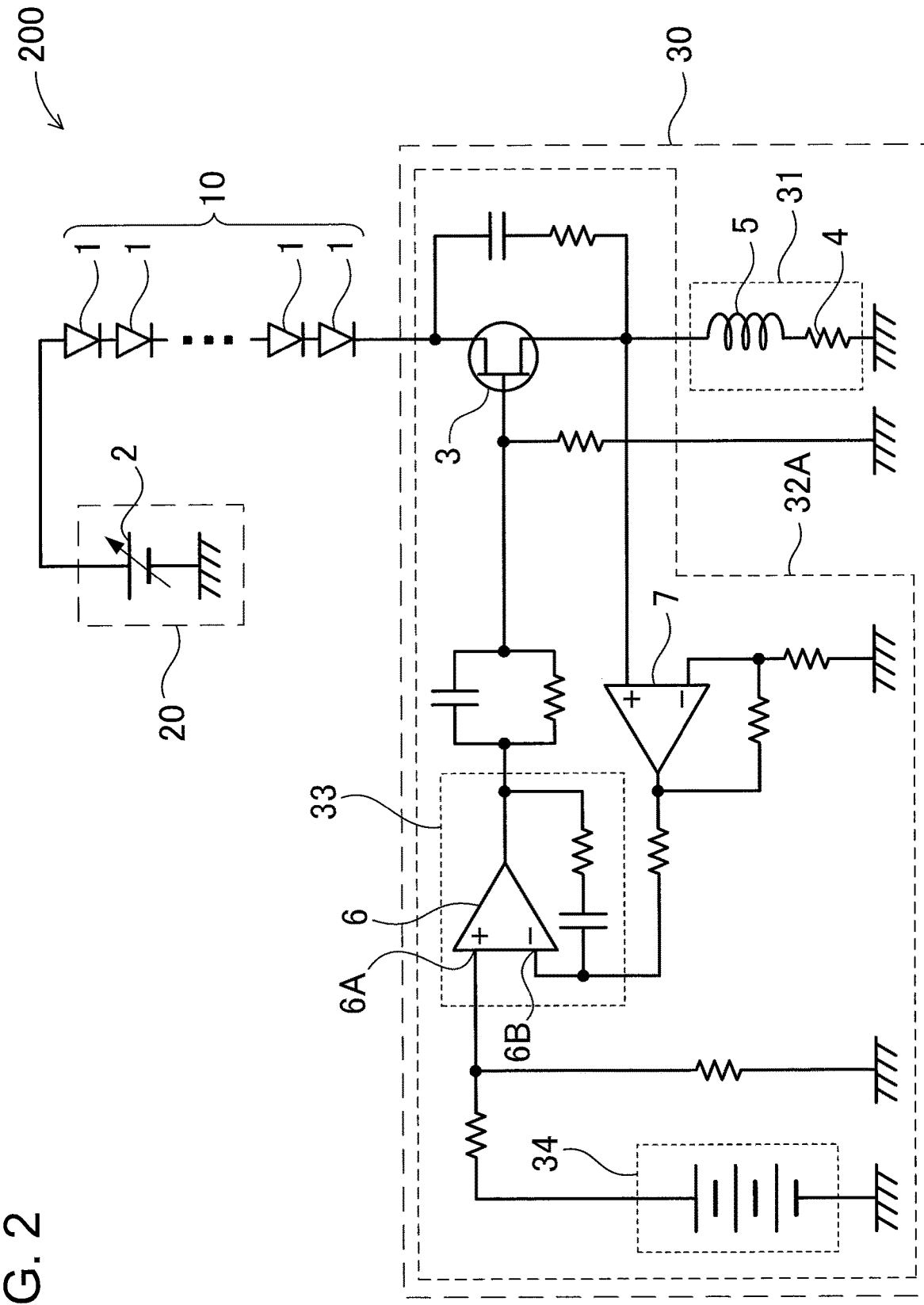
FIG. 2 is a block diagram of a light source device according to a second embodiment.

FIG. 2 is a block diagram of the light source device 200 according to a second embodiment. A current-regulating circuit 32A of the light source device 200 shown in the drawing includes a sub-amplifier 7 that amplifies the voltage induced in the current detector 31. The light source device 200 has a characteristic of reducing heat of the current detector 31 generated by joule heat such that the detection error of the current detector 31 due to the temperature change can be reduced. The sub-amplifier 7 amplifies the voltage of the current detector 31 to be input to the comparator 33, which allows a predetermined voltage to be input to the comparator 33 while decreasing the electrical resistance and the inductance of the current detector 31 and reducing the detection voltage of the current detector 31. For example, in the case in which the sub-amplifier 7 has an amplification factor of 10, the electrical resistance and the inductance of the current detector 31 can be reduced to $\frac{1}{10}$ and the heat of the current detector 31 generated by joule heat can be reduced to $\frac{1}{10}$. In the comparator 33, in the case in which the reference voltage and the detection voltage to be input are too small, control of the current with high accuracy becomes difficult. For example, if the electrical resistance of the resistor 4 is 0.2Ω, with the current value to the diode load 10 of 2 A, the detection voltage becomes 0.4 V, which is input to the comparator 33. Although the calorific value of joule heat can be reduced by decreasing the electrical resistance of the resistor 4 to $\frac{1}{10}$, that is, 0.02Ω, the input voltage at the comparator 33 is reduced to 0.04 V, resulting in the difficulty in controlling the internal resistance of the transistor 3 with high accuracy. With the detection voltage of the current detector 31 being amplified to 10 times and being input to the comparator 33, the input voltage at the comparator 33 becomes 0.4 V, which allows the current to be controlled with high accuracy.

Third Embodiment

Figure 3:
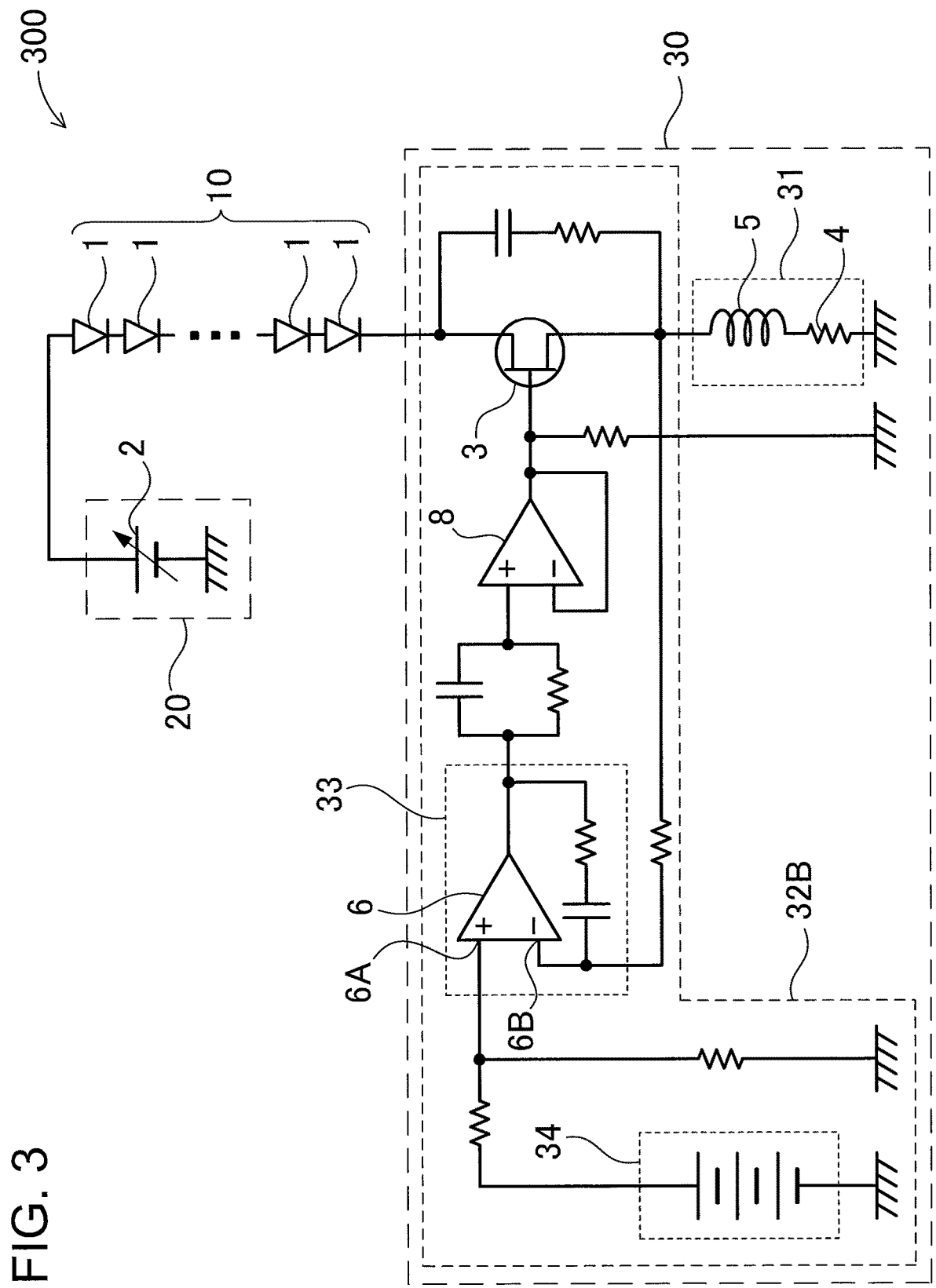
FIG. 3 is a block diagram of a light source device according to a third embodiment.
Figure 4:
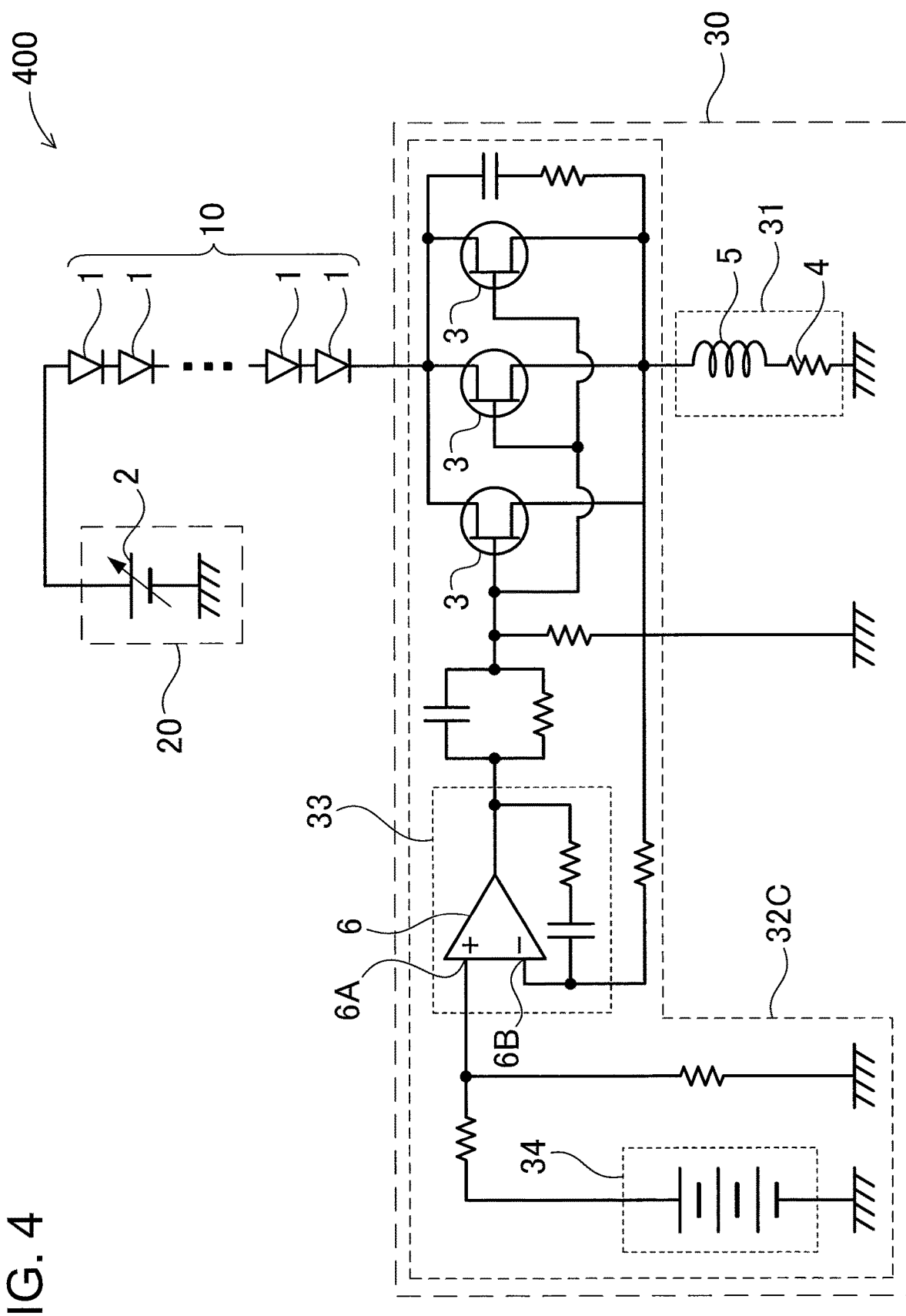
FIG. 4 is a block diagram of a light source device according to a fourth embodiment.

FIG. 3 is a block diagram of the light source device 300 according to a third embodiment. In a current-regulating circuit 32B of the light source device 300 shown in the drawing, a buffer amplifier 8 is connected between the output side of the comparator 33 and the input side of the transistor. The buffer amplifier 8 is an amplifier circuit with 100% negative-feedback, which can reduce the output impedance. In the buffer amplifier 8, impedance conversion is applied to the output of the comparator 33, and resulting output is input to the transistor 3. In the light source device 300, the output impedance of the comparator 33 is reduced by the buffer amplifier 8 and is input to the transistor 3, so that the input capacity of the transistor 3 is promptly charged. The internal resistance of the transistor 3 can be promptly controlled by the output signal of the comparator 33, which allows for responding to the increase in peak current in a short time. Further, the peak current is more efficiently reduced.

A transistor with a large current capacity, such as MOSFET and IGBT, has a large input capacitance. Accordingly, in the peak current limiting circuit including a transistor 3 of MOSFET or IGBT, the light-emitting output is increased by increasing the current to the diode load. However, such a large input capacitance of the transistor 3 causes a delay in response time. In the peak current limiting circuit 30 shown in FIG. 3, the output impedance of the buffer amplifier 8 with 100% negative-feedback is small, and the delay in response time of the transistor 3 having a large input capacitance can be shortened. Thus, the peak current limiting circuit 30 can increase the current to the diode load 10 to increase light-emitting output and can also reduce the peak current to the diode load 10 promptly.

While certain embodiments according to the present invention have been illustrated above, the present invention is not limited to the embodiments described above. Any appropriate configurations within the gist of the present invention can be within the scope of the present invention.

The light source device according to the present disclosure can be effectively used for a light source device in which a plurality of light-emitting elements are connected in series to have an increased light-emitting output.

The invention claimed is:

1. A light source device to supply a constant current to a diode load, the diode load comprising a plurality of light-emitting elements connected in series, the light source device comprising:
    a power supply circuit configured to be connected to the diode load; and
    a peak current limiting circuit configured to be connected in series to the diode load,
    wherein the peak current limiting circuit comprises
        a current detector connected in series to the diode load, and
        a current-regulating circuit configured to control a current to the diode load by a detection voltage of the current detector, and
    wherein the current detector comprises a series circuit comprising a resistor and a coil, the current detector configured to detect the detection voltage across the resistor and the coil.

2. The light source device according to claim 1, wherein the power supply circuit comprises a constant-current power supply.

3. The light source device according to claim 1, wherein the resistor comprises a wire-wound resistor.

4. The light source device according to claim 1, wherein the light-emitting elements comprise laser diodes.

5. A light source device to supply a constant current to a diode load, the diode load comprising a plurality of light-emitting elements connected in series, the light source device comprising:
    a power supply circuit configured to be connected to the diode load; and
    a peak current limiting circuit configured to be connected in series to the diode load,
    wherein the peak current limiting circuit comprises
        a current detector connected in series to the diode load, and
        a current-regulating circuit configured to control a current to the diode load by a detection voltage of the current detector,
    wherein the current detector comprises a series circuit comprising a resistor and a coil,
    wherein the current-regulating circuit comprises:
        a transistor having an input side and configured to be connected in series to the diode load and the current detector;
        a comparator having a first input terminal and a second input terminal, and connected to the input side of the transistor; and
        a reference voltage circuit to input a reference voltage to the first input terminal of the comparator,
    wherein a detection voltage induced in the current detector is input to the second input terminal of the comparator,
    wherein an output of the comparator is input to the transistor, and
    wherein the transistor is configured to control a current to the diode load.

6. The light source device according to claim 5, wherein the transistor comprises at least one FET.

7. The light source device according to claim 6,
wherein the at least one FET comprises a plurality of FETs, and
wherein the plurality of FETs are connected in parallel.

8. The light source device according to claim 5, wherein the reference voltage circuit comprises a circuit configured to change a reference voltage.

9. The light source device according to claim 5, further comprising a sub-amplifier to amplify a voltage induced in the current detector,
wherein an output voltage of the sub-amplifier is input to the first input terminal of the comparator.

10. The light source device according to claim 5, further comprising a buffer amplifier connected between an output side of the comparator and an input side of the transistor,
wherein the buffer amplifier reduces and outputs an output impedance of the comparator.

11. A light source device comprising:
a diode load comprises a plurality of light-emitting elements connected in series;
a power supply circuit connected to the diode load to supply a constant current to a diode load; and
a peak current limiting circuit connected in series to the diode load,
wherein the peak current limiting circuit comprises
a current detector connected in series to the diode load, and
a current-regulating circuit configured to control a current to the diode load by a detection voltage of the current detector, and
wherein the current detector comprises a series circuit comprising a resistor and a coil, the current detector configured to detect the detection voltage across the resistor and the coil.

12. The light source device according to claim 11,
wherein the current-regulating circuit comprises:
a transistor having an input side and connected in series to the diode load and the current detector;
a comparator having a first input terminal and a second input terminal, and connected to the input side of the transistor; and
a reference voltage circuit to input a reference voltage to the first input terminal of the comparator,
wherein a detection voltage induced in the current detector is input to the second input terminal of the comparator,
wherein an output of the comparator is input to the transistor, and
wherein the transistor controls a current to the diode load.

13. The light source device according to claim 12, wherein the transistor comprises at least one FET.

14. The light source device according to claim 13,
wherein the at least one FET comprises a plurality of FETs, and
wherein the plurality of FETs are connected in parallel.

15. The light source device according to claim 12, wherein the reference voltage circuit is configured to change a reference voltage.

16. The light source device according to claim 12, further comprising a sub-amplifier to amplify a voltage induced in the current detector,
wherein an output voltage of the sub-amplifier is input to the first input terminal of the comparator.

17. The light source device according to claim 12, further comprising a buffer amplifier connected between an output side of the comparator and an input side of the transistor,
wherein the buffer amplifier reduces and outputs an output impedance of the comparator.

18. The light source device according to claim 11, wherein the power supply circuit comprises a constant-current power supply.

19. The light source device according to claim 11, wherein the resistor comprises a wire-wound resistor.

20. The light source device according to claim 11, wherein the light-emitting elements comprise laser diodes.

* * * * *